(12) United States Patent
Ihara (10) Patent No.: US 6,767,866 B1
(45) Date of Patent: Jul. 27, 2004

(54) SELECTIVE REDUCTION TYPE HIGH TEMPERATURE SUPERCONDUCTOR AND METHODS OF MAKING THE SAME

(75) Inventor: Hideo Ihara, Ibaraki (JP)

(73) Assignees: Japan Science and Technology Agency, Kawaguchi (JP); National Institute of Advanced Industrial Science and Technology, Tokyo (JP)

(*) Notice: Subject to any disclaimer, the term of this patent is extended or adjusted under 35 U.S.C. 154(b) by 0 days.

(21) Appl. No.: 09/926,228

(22) PCT Filed: Mar. 17, 2000

(86) PCT No.: PCT/JP00/01699

§ 371 (c)(1),
(2), (4) Date: Sep. 26, 2001

(87) PCT Pub. No.: WO00/58218

PCT Pub. Date: Oct. 5, 2000

(30) Foreign Application Priority Data

Mar. 26, 1999 (JP) .......................................... 11-085003

(51) Int. Cl.$^7$ ........................ C04B 101/00; C04B 35/64
(52) U.S. Cl. ........................ 505/125; 505/120; 505/121; 505/470; 505/500
(58) Field of Search ................................. 505/120, 121, 505/125, 470, 473, 500, 501, 826, 833

(56) References Cited

U.S. PATENT DOCUMENTS

| | | | | |
|---|---|---|---|---|
| 5,776,862 A | * | 7/1998 | Usami et al. | ................ 505/125 |
| 5,919,735 A | * | 7/1999 | Ihara et al. | ................ 505/125 |
| 6,281,171 B1 | * | 8/2001 | Ihara et al. | ................ 505/125 |
| 6,300,284 B1 | * | 10/2001 | Ihara et al. | ................ 505/125 |
| 6,444,620 B2 | * | 9/2002 | Ihara | ......................... 505/125 |

OTHER PUBLICATIONS

Ihara et al "Cu1–xTlxBa2Ca3Cu4O12–y Superconductor with Tc of 126 K", Physica C, M2S–HTSC 1997.*
Shimoyama et al "Strong Flux Pinningup to liquid nitrogen temperature . . . ", Physica C, 28(1), 69–75, 1997.*
Shimoyama et al "Dramatically improved Flux Pinning Propertiesof heavily Pb–doped Bi2212 single crystals . . . ", Adv. Supercond. X, Proc. Int. Symp. Supecond., 10th (1998), vol. 1, 279–284. Meeting date Oct. 1997.*
Hideo Ihara et al., "Low Anisotropic High–Tc Superconductor Cu–1234 System", Denshi Gihutsu Sougou Kenkyuusho Ihou, vol. 62, No. 12, Mar. 20, 1999, pp. 75–82.
B. Morosin et al., "T1–0 Charge Reservoir Changes on Annealing T1–1223 Crystals", Physica C, vol. 183, 1991, pp. 90–98.

* cited by examiner

*Primary Examiner*—Mark Kopec
(74) *Attorney, Agent, or Firm*—Westerman, Hattori, Daniels & Adrian, LLP (57) ABSTRACT

Proposed are a selective reduction type high temperature superconductor and methods of making the same, the superconductor having a pair of charge supply layers each formed of a Cu1-xMx surface (1, 1), a first superconducting layer formed of a 5-coordination CuO2 surface (2) and a second superconducting layer formed of a 4-coordination CuO2 surface (3). Reducing M ions (e.g., Tl ions) in the charge supply layers by heat treatment in a reducing atmosphere enables the 5-coordination CuO2 surface (2) as the first superconducting layer to be over-doped and the 4-coordination CuO2 surface (3) as the second superconducting layer to be optimum-doped. According to the present invention, a high temperature superconductor is provided that with its critical temperature held high has a reduced superconducting anisotropy γ, and provides a high critical current density Jc and a high c irreversibility field Hirr.

22 Claims, 9 Drawing Sheets

FIG. 3  The nitrogen-atmosphere-annealing temperature dependency of the electrical resistivity Differential thermal analysis of (Cu, Tl)-1223

FIG. 4

FIG. 5  Hole concentration for Cu found from measurement of Hall coefficient

SELECTIVE REDUCTION TYPE HIGH TEMPERATURE SUPERCONDUCTOR AND METHODS OF MAKING THE SAME

TECHNICAL FIELD

This invention relates to a selective reduction type, high temperature superconductor, which is a copper (Cu) oxide, high temperature superconductor that permits doping with positive holes by selectively reducing constituent elements (atoms). This superconductor can be used in large scale superconducting power transmission, superconducting power storage or reserve, superconducting electronics such as a high performance Josephson device, a high frequency device or the like. The invention also relates to methods of making such a superconductor.

BACKGROUND ART

Conventional Cu-oxide family, high temperature superconductors have been prepared doping with positive holes, by oxidation, to raise the contents of the superconducting carriers. Such a high temperature superconductor, however, may cause the carriers to reduce in concentration due to diffusion or bleeding of oxygen atoms by increased temperature. This leads to a depletion in superconductivity of the superconductor.

Also, doping with positive holes to obtain a higher carrier concentration has been thought to require a higher oxygen partial pressure, and it has so far been unattainable to prepare a superconductor of the type described by doping with positive holes to raise the carrier concentration in a reduction process conditioned under low partial pressure or vacuum. Since it has been found impossible to increase the concentration of positive holes by reduction, i.e., by lowering the oxygen partial pressure, the conventional high temperature superconductors have the problem that they have a limited carrier concentration and are thus low and unsatisfactory in their superconducting properties that include the critical temperature Tc, critical current density Jc, irreversible magnetic filed Hirr. It has therefore been sought to, solve the problem of bringing into realization a high temperature superconductor of a reduced oxygen concentration.

With these problems taken into account, it is accordingly a first object of the present invention to provide a selective reduction type, high temperature superconductor that permits doping with positive holes by selectively reducing constituent elements (atoms).

Another object of the present invention is to provide a method of making a selective reduction type, high temperature superconductor.

DISCLOSURE OF THE INVENTION

In order to achieve the first object mentioned above, there is provided in accordance with the present invention, a selective reduction, high temperature superconductor, wherein it has a portion of its constituent elements selectively reduced whereby it has a superconducting layer thereof doped with positive holes.

The present invention also provides a selective reduction type, high temperature superconductor that has a portion of its constituent elements selectively reduced whereby there are formed in superconducting layers a first and a second region doped overly and doped optimally with superconducting carriers, respectively.

The present invention further provides a selective reduction type, high temperature superconductor that has a portion of its constituent elements selectively reduced whereby the superconductor as a whole has a superconducting carrier concentration such that it is held doped overly or doped optimally with superconducting carriers.

The present invention also provides a selective reduction type, high temperature superconductor that has on each of an upper and a lower surface of a unit lattice thereof a charge supply layer having each of a portion of Cu atoms substituted with a selectively reducible atom.

The present invention also provides a selective reduction type, high temperature superconductor in which the said superconducting layers have an upper and a lower surface constituted by a $CuO_2$ layer of 5-coordination and a layer other than the upper and lower constituted by a $CuO_2$ layer of 4-coordination, the said $CuO_2$ layer of 5-coordination and 4-coordination having been over- and optimum-doped, respectively, by selective reduction.

Further, the present invention provides a selective reduction type, high temperature superconductor having a selectively over-doped and/or a selectively optimum-doped construction.

The present invention further provides a selective reduction type, high temperature superconductor, characterized in that it is made of a (Cu, M) group, high temperature superconducting material, which can be described by composition formula:

$$Cu_{1-x}M_x(Ba_{1-y}Sr_y)_2(Ca_{1-z}L_z)_{n-1}Cu_nO_{2n+4-w}$$

where M represents ions of one or more polyvalent metallic elements selected from the class which consists of Tl, Bi, Pb, In, Ga, Sn, Ti, V, Cr, Mn, Fe, Co, Ni, Zr, Nb, Mo, W, Re and Os; L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

The present invention also provides selective reduction type, high temperature superconductor, characterized in that it is made of a (Cu, Tl) group, high temperature superconducting material that can be described by composition formula:

$$Cu_{1-x}Tl_x(Ba_{1-y}Sr_y)_2(Ca_{1-z}L_z)_{n-1}Cu_nO_{2n+4-w}$$

where L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

The present invention also provides a selective reduction type, high temperature superconductor, characterized in that it is made of a (Cu, Tl) group, high temperature superconducting material that can be described by composition formula:

$$Cu_{1-x}Tl_x(Ba_{1-y}Sr_y)_2(Ca_{1-z}L_z)_2Cu_3O_{10-w}$$

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

The present invention also provides a selective reduction type, high temperature superconductor, characterized in that it is made of a high temperature superconducting material that can be described by composition formula:

$$Cu_{1-x}Tl_x(Ba_{1-y}Sr_y)_2(Ca_{1-z}L_z)_3Cu_4O_{12-w}$$

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

The present invention further provides a selective reduction type, high temperature superconductor, characterized in that selective over- or optimum-doping is effected by decrease in the valence number of ions of a constituent element by decrease in the oxygen concentration, that is by selective reduction, or by varying (increasing or decreasing) oxygen concentration.

The present invention also provides a selective reduction type, high temperature superconductor, characterized in that it is a selectively over-doped type or a selectively optimum-doped type, high temperature superconductor in which n is any one of 3, 4, 5, 6 and 7.

The present invention further provides a selective reduction type, high temperature superconductor having a construction that the reduction of selectively reducible ions causes the ions in the charge supply layers to receive electrons in their outer shell orbits, thereby providing holes in the $CuO_2$ layer of 5-coordination of a said superconducting layer.

The present invention further provides a selective reduction type, high temperature superconductor having a construction that it has a superconducting anisotropy of not greater than 10 and a coherence distance of not less than 3 angstroms.

The present invention further provides a selective reduction type, high temperature superconductor having a construction that said selective reduction transforms its natural superconducting wave function that is of a d-wave high in spatial anisotropy to a wave function of a (d+is) wave that has also a property of an s-wave lacking of spatial anisotropy.

A selective reduction type, high temperature superconductor so constructed as mentioned above according to the present invention can be prepared in a reducing atmosphere or can in use have its oxygen content decreased, yet still maintain a high critical temperature Tc, while providing a reduced aniso-superconductivity γ, a high critical current density Jc and a high critical magnetic field Hirr.

Stated otherwise, a selective reduction type, high temperature superconductor according to the present invention is provided with a crystalline and an electronic structure that permits achieving improved Jc and Hirr while maintaining Tc high. Moreover, provided with a superconducting wave function of a (d+is) wave, it is low in superconducting anisotropy. With these advantages, it can be used as a high performance, high temperature superconductor in a variety of industrial sub-fields concerned.

In order to achieve the second object mentioned above, the present invention provides a method of making a selective reduction type, high temperature superconductor, which comprises the steps of: preparing a high temperature superconductor, and heat-treating the prepared high temperature superconductor in a reducing atmosphere.

The present invention also provides a method of making a selective reduction type, high temperature superconductor, comprising the steps of: using an amorphous film as a precursor of high temperature superconductor; causing the amorphous film to grow epitaxially by amorphous phase epitaxy; and heat-treating in a low oxygen, reducing atmosphere the amorphous film that has grown epitaxially.

The present invention further provides a method of making a selective reduction type, high temperature superconductor, comprising the steps of: causing added constituent elements to develop their self-assembling (or self-forming) effect; and causing the high temperature superconductor to grow epitaxially by the self-assembling effect.

A method of making a selective reduction type, high temperature superconductor of the present invention as mentioned above is applicable to making a (Cu, M) group, selective reduction type, high temperature superconductor expressed by composition formula:

where M represents ions of one or more polyvalent metallic elements selected from the class which consists of Tl, Bi, Pb, In, Ga, Sn, Ti, V, Cr, Mn, Fe, Co, Ni, Zr, Nb, Mo, W, Re and Os; L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

A method of making a selective reduction type, high temperature superconductor of the present invention as mentioned above is also applicable to making a (Cu, Tl) group, selective reduction type, high temperature superconductor expressed by composition formula:

where L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

A method of making a selective reduction type, high temperature superconductor of the present invention as mentioned above is also applicable to making a (Cu, Tl) group, selective reduction type, high temperature superconductor expressed by composition formula:

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

A method of making a selective reduction type, high temperature superconductor of the present invention as mentioned above is also applicable to making a selective reduction type, high temperature superconductor expressed by composition formula:

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

A method of making a selective reduction type, high temperature superconductor of the present invention so constructed as mentioned above permits manufacturing a positive hole dopable or doped selective reduction type, high temperature superconductor.

BRIEF DESCRIPTION OF THE DRAWINGS

The present invention will better be understood from the following detailed description and the drawings attached hereto showing certain illustrative forms of embodiment of the present invention. In this connection, it should be noted that the embodiments illustrated in the accompanying drawings hereof are intended in no way to limit the present invention but to facilitate an explanation and understanding thereof.

In the drawings.

BEST MODES FOR CARRYING OUT THE INVENTION

Hereinafter, the present invention for a selective reduction type, high temperature superconductor and a method of its making will be described in detail with respect to suitable forms of embodiment thereof illustrated in FIGS. 1 to 9.

While the conventional methods for increasing the carrier concentration in a high temperature superconductor rely either on oxidation by heat treatment in high pressure oxygen or on substitution to form elements of varying valence numbers, a selective reduction type, high temperature superconductor according to the present invention is characterized in that it has an increased concentration of positive holes achieved by reduction, namely by lowering the oxygen concentration, which permits enhancing its Tc (critical temperature), Jc (critical current density) and Hirr (critical magnetic field) to a considerable extent.

A Cu-oxide super conductor of the present invention:

$$Cu_{1-x}M_x(Ba_{1-y}Sr_y)_2(Ca_{1-z}L_z)_{n-1}Cu_nO_{2n+4-w}$$

includes charge supply layers formed by $Cu_{1-x}M_x$ plane that make up the upper and lower surfaces of a unit lattice, and superconducting layers that make up the other layers (other than the upper and lower) of the unit lattice, namely those formed by $CuO_2$ planes of a pyramidal $CuO_5$ cluster, i.e., $CuO_2$ planes of 5 coordination number and those formed by $CuO_2$ planes of a planar $CuO_4$ cluster, i.e., $CuO_2$ planes of 4 coordination number, these different superconducting layers being laid alternately one on another.

FIGS. 1 and 2 illustrate modeled crystal structures of selective reduction type, high temperature superconductors of the present invention. These modeled crystal structures are illustrated for a $CuBaCa_{n-1}O_{2n+4-w}$ where $1 \leq n \leq 16$ and $0 \leq w \leq 4$, in particular with respect to examples thereof in which n is an integer from 1 to 5.

Figure 1A:
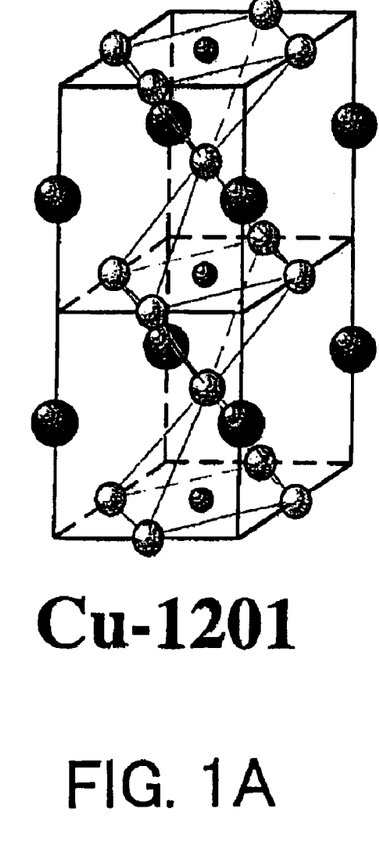
FIG. 1 is a diagram showing modeled crystalline structures of a selective reduction type, high temperature superconductor according to the present invention in which A and B show unit lattices with n=1 and n=2, respectively.
Figure 1B:
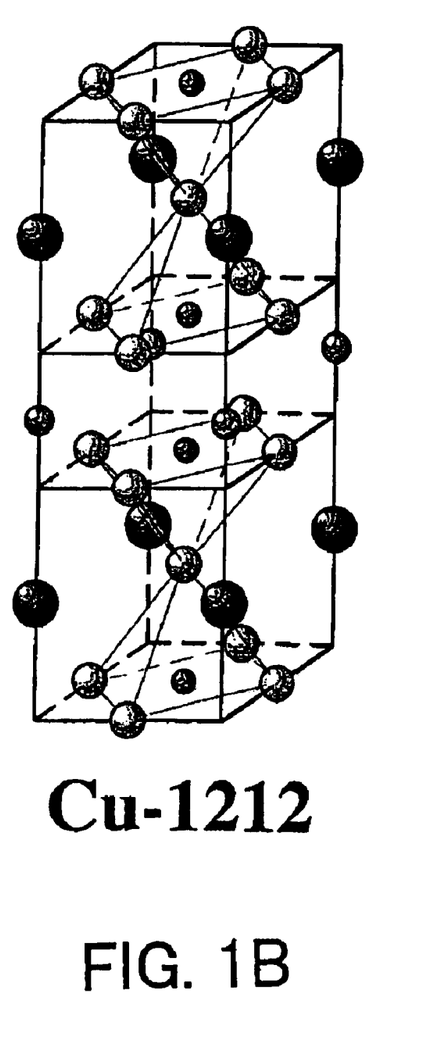
Figure 2A:
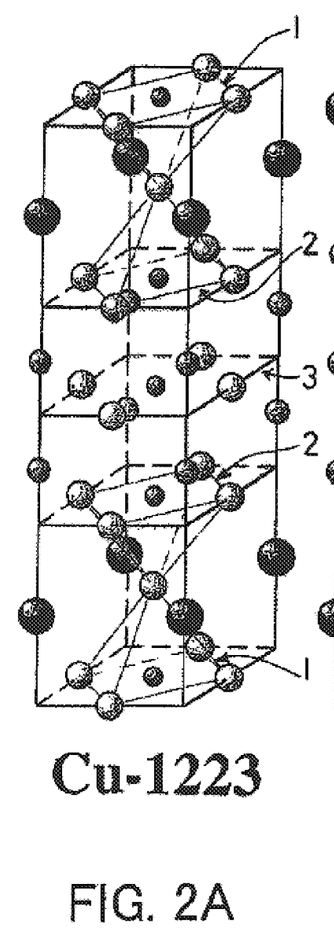
FIG. 2 is a diagram showing modeled crystalline structures of a selective reduction type, high temperature superconductor according to the present invention in which A, B and C show unit lattices with n=3, n=4 and n=5, respectively.
Figure 2B:
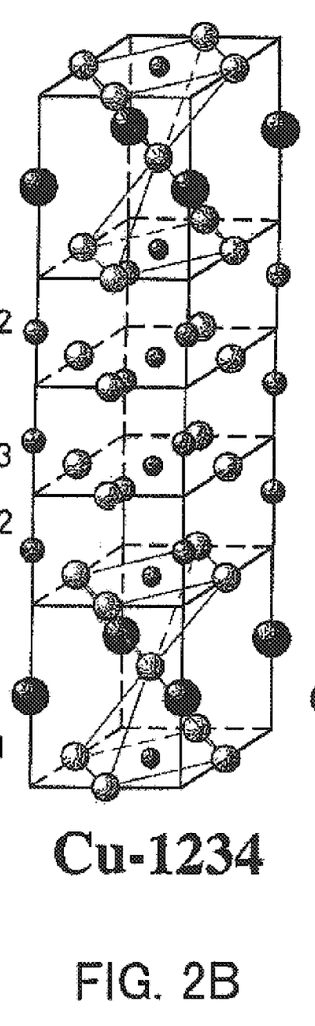
Figure 2C:
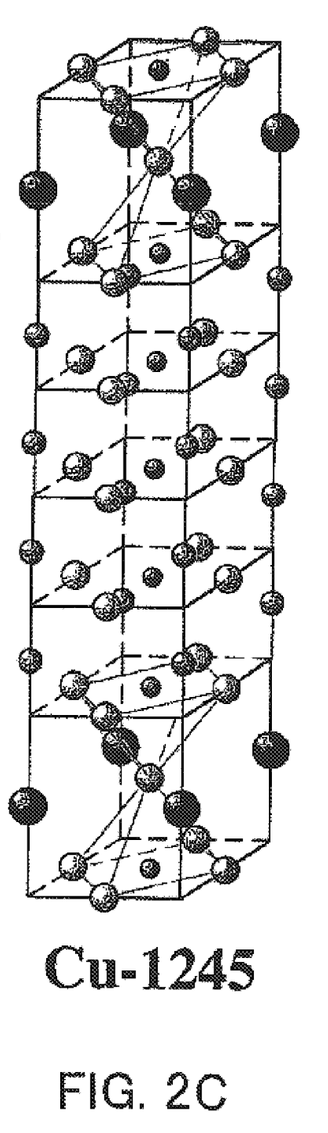

FIG. 1A is for a unit lattice where n is 1, and FIG. 1B is for a unit lattice where n is 2. In FIG. 2, A, B and C are for unit lattices where n is 3, 4 and 5, respectively.

Referring to FIG. 2A, a selective reduction type, high temperature superconductor of the present invention comprises a pair of $Cu_{1-x}M_x$ planes 1, 1 that constitute its charge supply layers, a $CuO_2$ plane 2 of 5 coordination number that constitutes a superconducting layer and a $CuO_2$ plane 3 of 4 coordination number that constitutes a superconducting layer.

According to a selective reduction method of the present invention, a superconducting layer is formed as a $CuO_2$ plane 2 of coordination number 5 in which the density of positive holes is such that it is either overly (excessively) or optimally doped with them, or nearly so doped, and is formed as a $CuO_2$ plane 3 of coordination number 4 in which the density of positive holes is such that it is optimally or nearly optimally doped with them. To wit, the method permits forming an excessively or optimally doped $CuO_2$ plane and an optimally doped $CuO_2$ plane selectively and separately.

A selective reduction method of the present invention is a method whereby polyvalent, reducible ions (e.g., Tl ion) substituted for a portion of Cu ions in the charge supply layers of a high temperature superconductor are reduced (their ionic valence is reduced) by decreasing the oxygen content in the high temperature superconductor (e.g., by heat treatment in a reducing atmosphere). It is by this reduction of reducible substituted ions that the electronic and band structures of a Cu-oxide high temperature superconductor vary and a mechanism is revealed that permits doping with positive holes. It should also be noted at this point that term "selective reduction type high temperature superconductor" as used herein, of the present invention is intended to refer to a high temperature superconductor that comprises a pair of charge supply layers constituted by an upper and a lower surface of a unit superconductor lattice having each of a portion of Cu atoms I these surfaces substituted with polyvalent, reducible ions and having these substitutional ions exclusively and selectively reduced, and a superconducting layer as a layer other than those upper and lower surfaces.

Figure 7:
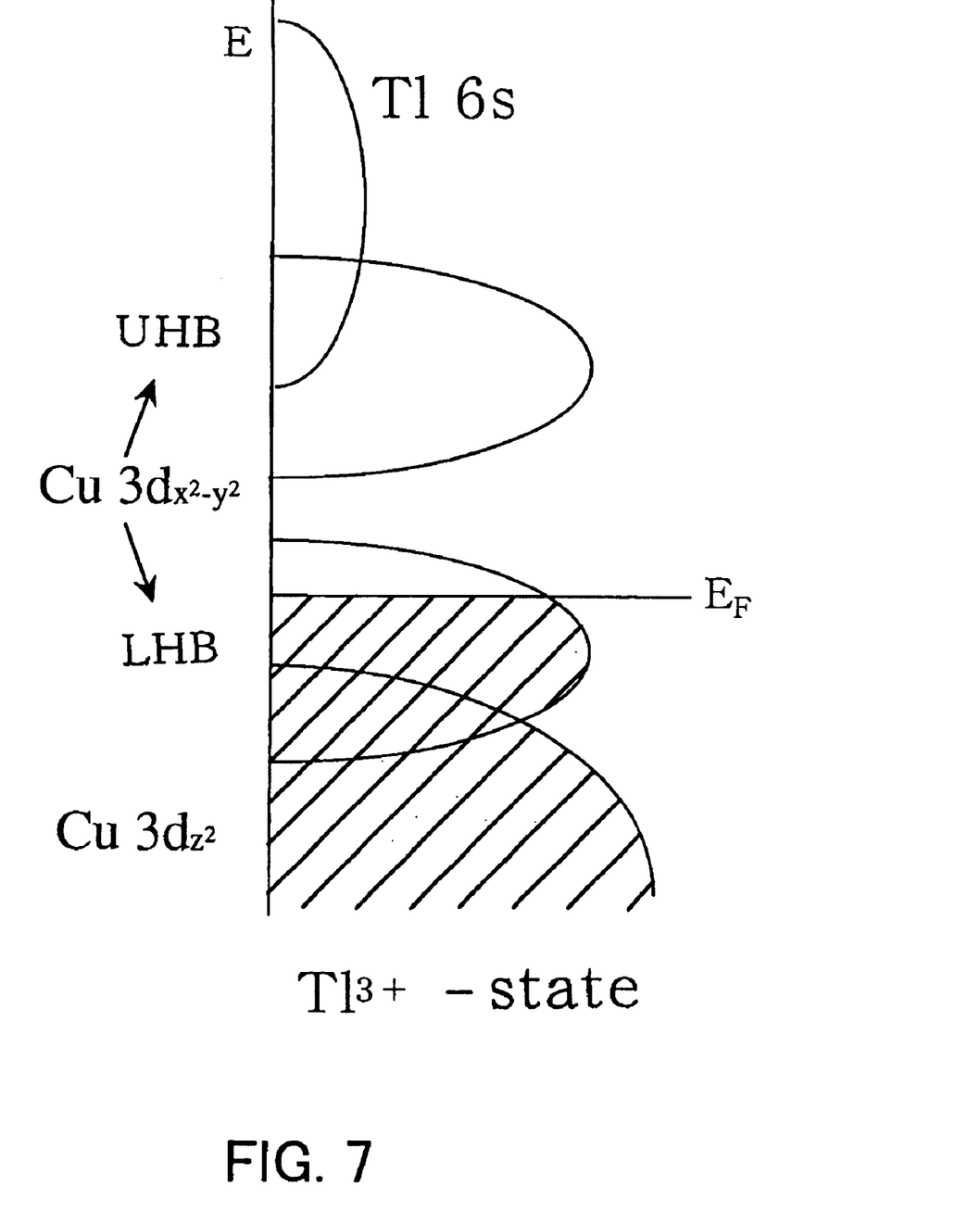
FIG. 7 is a diagram showing an electronic state according to the first form of embodiment of the invention that is high in oxygen concentration.
Figure 8:
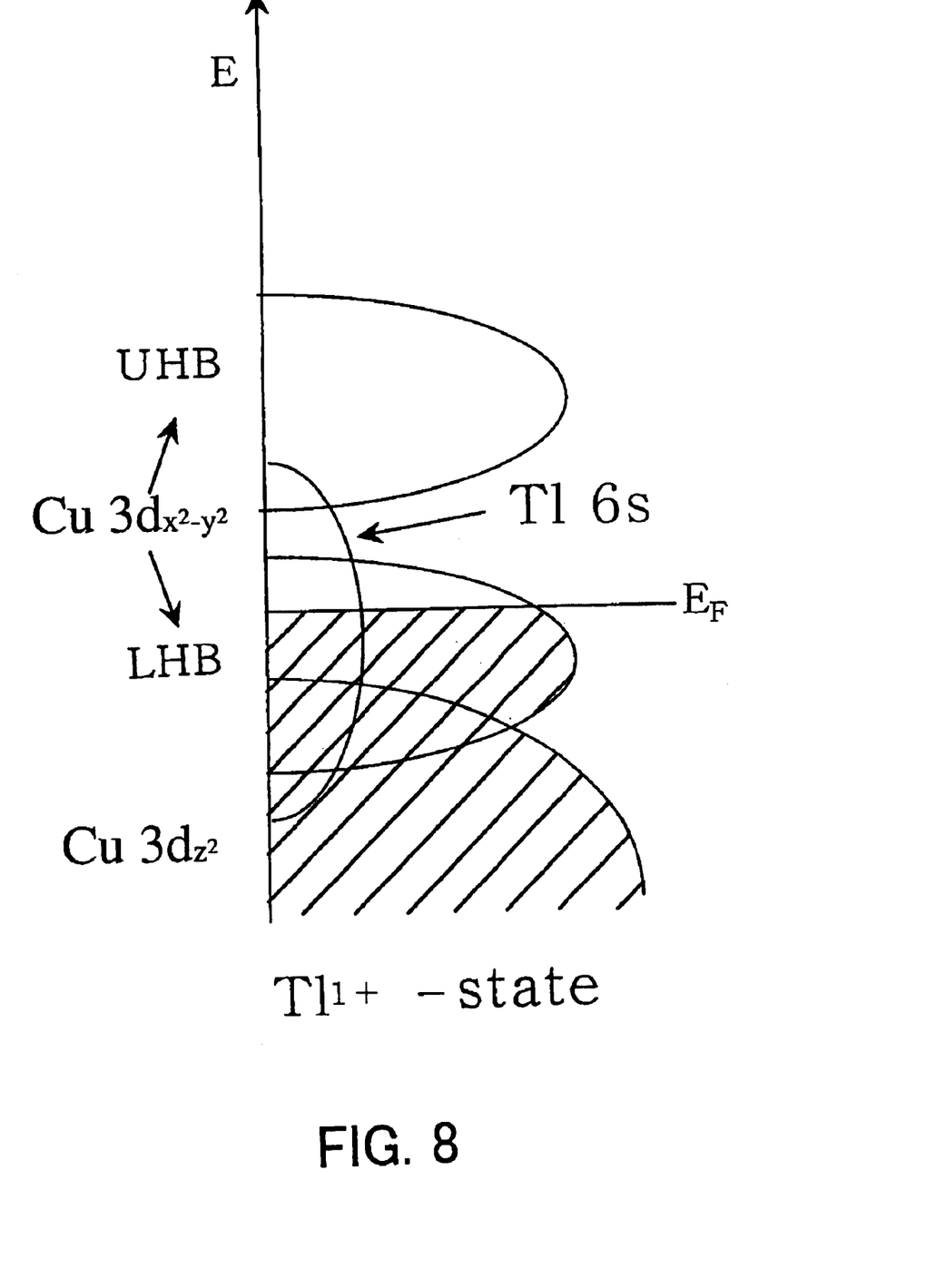
FIG. 8 is a diagram showing an electronic state according to the first form of embodiment of the invention that is low in oxygen concentration.

FIG. 7 is a diagram that shows an electronic state of the $CuO_2$ plane 2 of an afore-mentioned Cu-oxide, high temperature superconductor in case its oxygen content is high, and FIG. 8 is a diagram that shows an electronic state of the $CuO_2$ plane 2 of an afore-mentioned Cu-oxide, high temperature superconductor in case its oxygen content is decreased.

Referring to FIGS. 7 and 8, if the oxygen content is high it is seen that Tl ions present in a charge supply layer is in a plus (+) trivalent state and the Tl6 s level is above the Fermi level. If as a result of oxygen reduction the oxygen content is lowered, Tl ions take a plus monovalent state and the Tl6 s level lies below the Fermi level.

As a consequence, electrons are pulled out of the $CuO_2$ plane of coordination number 5 as a superconducting layer and holes are supplied into the $CuO_2$ plane of coordinate number 5, the superconducting layer. In this way, reducing reducible polyvalent ions such as Tl ions by decreasing the oxygen content, namely supplying positive holes by selective reduction permits increasing the carrier concentration. In the context hereof, supplying positive holes by selective reduction is referred to as selective doping.

Using selective doping enables producing a high performance, high temperature superconductor. For example, heat-treating in a reducing atmosphere such a high temperature superconductor formed in an overly doping composition to decrease oxygen by a certain amount decreases the carrier concentration because of the superconducting layers losing oxygen, but permits the $CuO_2$ plane 2 of coordination number 5 as one superconducting layer to stay in an overly doped state by being injected with holes by selective doping.

On the other hand, the 4-coordination $CuO_2$ plane 3 providing for the other superconducting layer is not doped with holes and therefore has a reduced carrier concentration, staying in an optimally doped state. Thus, a makeup is provided in which while the superconducting layers as a whole are overly doped, there also exists an optimally doped $CuO_2$ plane. The method mentioned above is referred to herein as selective over-doping method. Likewise, it is also possible to make both the 5-coordination and 4-coordination $CuO_2$ plane superconducting layers doped optimally as a whole in their carrier concentration. This alternative method is referred to herein as selective optimum doping method.

A difference in potential level between more than one types of $CuO_2$ planes and a difference in energy level between the bands which these $CuO_2$ planes possess can be used in this manner to permit the over-doped CuO2 plane and the optimum-doped to coexist in a unit lattice, and thus to have Tc, Jc and Hirr of the superconductor raised considerably.

By the way, Tc varies with respect to the amount of doping, parabolically or along a parabolic curve opening downwards, whereon the optimum doping is established at the amount of doping at which Tc becomes maximum. In the case of Cu-oxide high temperature superconductors, this corresponds to the number of holes for one Cu (atom) that is 0.2 to 0.23. Further, over-doping indicates the amount of doping that is greater than that for optimum doping. Using the selective over-doping method according to the present invention gives rise to over-doping as a whole, but by the presence of an optimum-doped superconducting layer as mentioned above does not lower Tc despite over-doping.

Thus, in a Cu-oxide, selective reduction type, high temperature superconductor of the present invention, use is made of a change in the electronic and band structures formed by substitution of polyvalent reducible ions, e.g., Tl ions, for a portion of Cu ions in the charge supply layers to realize a mechanism that permits selective doping with positive holes.

This mechanism in a selective reduction type, high temperature superconductor of the present invention despite shortage of oxygen in the superconducting layers or against the inability to enough supply them with oxygen in the preparation step of the superconductor causes the substitute ions to pull electrons out of the superconducting layers and thus to supply them with positive holes. Accordingly, there results here no deterioration in properties as does if oxygen comes off, and then the preparation in an atmosphere of low oxygen partial pressure still permits yielding a high temperature superconductor of high performance.

Further, given the superconducting layers formed in an over-doped state as suitably composed and structured, the use of this mechanism whereby selective doping by selective reduction permits the 5-coordination $CuO_2$ plane to stay over-doped while rendering the 4-coordination $CuO_2$ plane optimum-doped makes it possible to raise Jc while at the same time holding Tc high. In this case, the superconducting layers may, as suitably composed and structured, be formed also in an optimum-doped state.

While both optimum-doping and over-doping are described above as being controllable by decrease in the valence number of Tl ions by reduction in oxygen content, it is, of course, possible to control them by increase and decrease in oxygen content.

A selective reduction type, high temperature superconductor of the present invention as described above can be made first by preparing a high temperature superconductor by using high pressure synthesis, hot pressing, spattering, laser ablation or the like irreversible or non-equilibrium process of manufacture, and then by subjecting it to reduction heat-treatment.

The above-mentioned method of making according to the present invention is applicable to making selective reduction type, high temperature superconductors as can be described by the composition formula (a) mentioned below. Composition Formula (a):

where M represents ions of one or more polyvalent metallic elements selected from the class which consists of Tl, Bi, Pb, In, Ga, Sn, Ti, V, Cr, Mn, Fe, Co, Ni, Zr, Nb, Mo, W, Re and Os; L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

The above-mentioned method of making according to the present invention is further applicable to making selective reduction type, high temperature superconductors as can be described by the composition formula (b) mentioned below. Composition Formula (b):

where L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

In order to prepare thin films of a Cu-oxide superconductor:

having a layer structure according to the present invention, it is necessary that charge supply layers and superconducting layers be laid one on another alternately. Also required is that each layer be formed under accurate control of its composition and crystallinity and be of a large area.

This in turn requires, in addition to physical control such as for temperature and pressure, that additional element M exhibit its auto-forming capacity and that the crystal periodicity and atomic ordering in the $CuO_2$ plane and in the direction perpendicular thereto be enhanced to an ideal level. An improvement in the in-plane ordering by the epitaxial effect an improvement in the crystallinity in the plane and in the direction perpendicular thereto by the chemical auto-formation effect of the additional element M result in a large improvement in the atomic ordering in the thin film crystal, which in turn contributes to a rise in superconductivity. An example of the additional element M is the utilization of M=Tl which possesses the structure stabilizing effect, the reaction accelerating effect, the charge supply effect and the Tc increasing effect together in combination. This additional element M has been found to exhibit the same or similar effects in forming high temperature superconductors other than those mentioned above. The method of making according to the present invention is designed to utilize the effects described above.

It should further be noted that a high temperature superconducting material according to the present invention possesses a d-wave superconductivity by being a material that is large in Coulomb repulsion and of strong correlativity. As a result, it is considerably large in superconducting anisotropy in the $CuO_2$ plane. This anisotropy can be made smaller by the selective reduction of the present invention. To wit, as shown in FIG. 8, performing the selective reduction brings electrons in the $CuO_2$ plane into a [d+is] state where an s-wave property is introduced that is characteristic of a superconducting material of weak correlativity. This leads to realization of a high performance superconducting material that is small in anisotropy.

It is thus seen that the method of making according to the present invention achieves the preceding effect as well.

Mention is next made of a first, preferred form of embodiment of the invention represented by an example having a composition: $(Cu_{1-x}Tl_x)Ba_2Ca_2Cu_3O_y$, where $0 \leq x \leq 1.0$ and $0 \leq y \leq 1$, and having a structure with a unit lattice illustrated in FIG. 2A. The structure of specimen for this first form of embodiment of the invention as indicated in FIG. 2A is referred to here as Cu-1223.

An explanation is first given in respect of a method of making this first form of embodiment of the invention.

Raw materials to make up a selective reduction type, high temperature superconductor as the first form of embodiment of the invention are: CuO, $BaCO_3$, $CaCo_2$, $BaO_2$ and $CaO_2$ with an oxidizing agent such as of AgO or $CaO_2$ and a reducing agent such as of $Cu_2O$.

First, a precursor of $Ba_2Ca_2Cu_2O_7$ has CuO and $Tl_2O_3$ mixed therewith in a proper amount, and a specimen having a composition: $(Cu_{1-x}Tl_x)Ba_2Ca_2Cu_3O_y$ (x=0.5) is prepared by synthesis in a cubic angle high pressure generating apparatus under conditions of 85° C., 5 Gpa and 2 hours.

Next, this specimen is annealed in a reducing atmosphere, e.g., of nitrogen gas, of a temperature range from 400° C. to 700° C., preferably at 540° C. for a period of 12 hours. This selective reduction treatment gives rise to a selective reduction type, high temperature superconductor of this form of embodiment of the invention.

What is to be mentioned further is that the above-mentioned method of making according to the present invention is also applicable to making selective reduction type, high temperature superconductors as can be described by the composition formula (c) mentioned below. Composition Formula (c):

$$Cu_{1-x}M_x(Ba_{1-y},Sr_y)_2(Ca_{1-z}L_z)_{n-1}Cu_nO_{2n+4-w}$$

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

An explanation is next given in respect of properties of the first form of embodiment of the invention.

Figure 3:
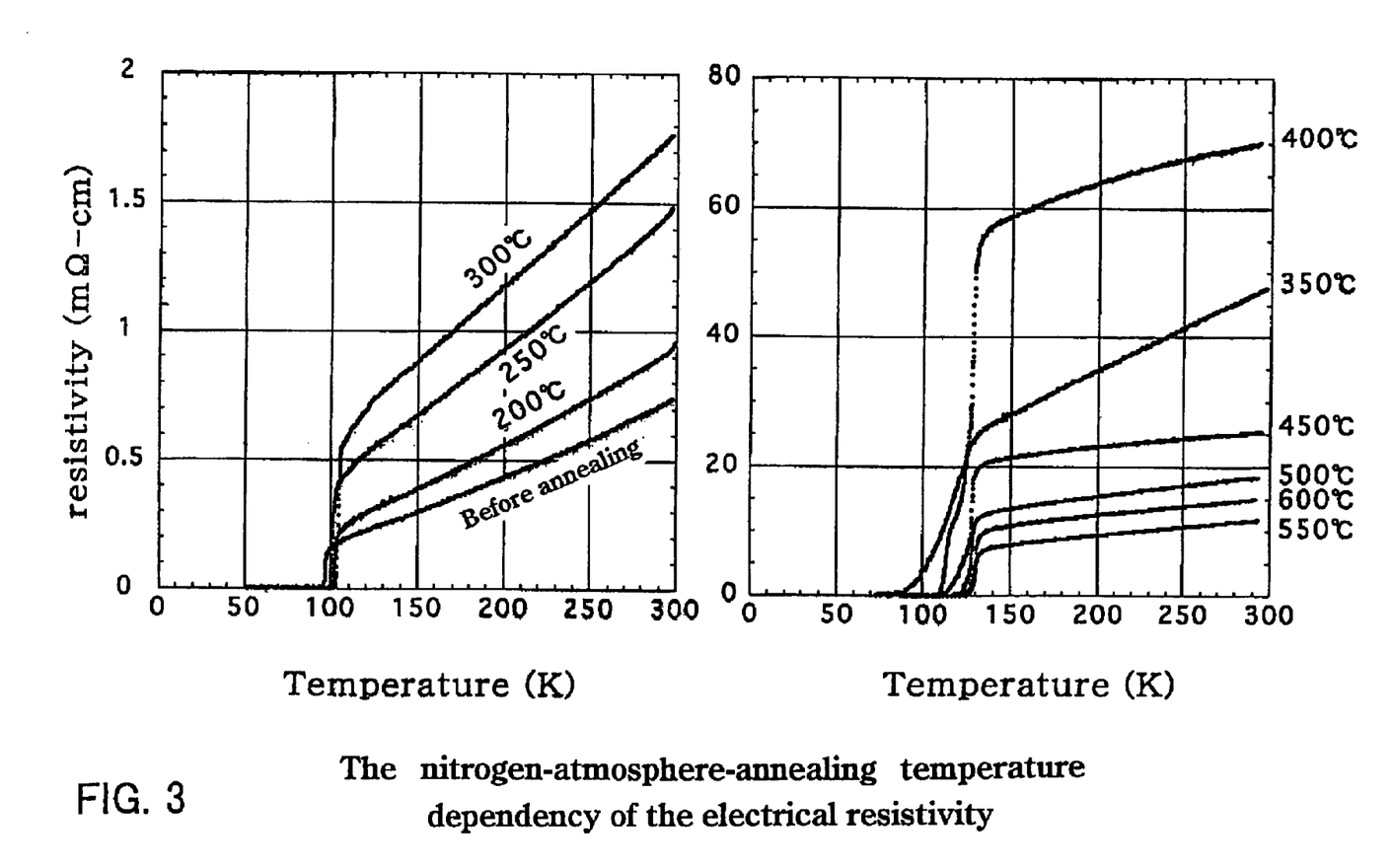
FIG. 3 is a diagram showing the temperature dependency of the electrical resistivity according to a first form of embodiment of the present invention annealed at various temperatures in a nitrogen atmosphere.

FIG. 3 is a diagram that indicates the temperature dependency of the electrical resistivity for various temperatures at which annealing is effected (for specimens) in the first form of embodiment.

As shown in FIG. 3, Tc rises from 97 K to 131 K as the annealing temperature is raised. The curves' gradient varies somewhat in the vicinity of Tc for the annealing temperatures from 350° C. to 450° C., apparently due to ununiformity of the specimen. A normal conduction electrical resistivity rises for the annealing temperature that is raised from 200° C. to 400° C., and then falls for the annealing temperature of 400° C. to 550° C., followed by a rise at the annealing temperature of 600° C.

Figure 4:
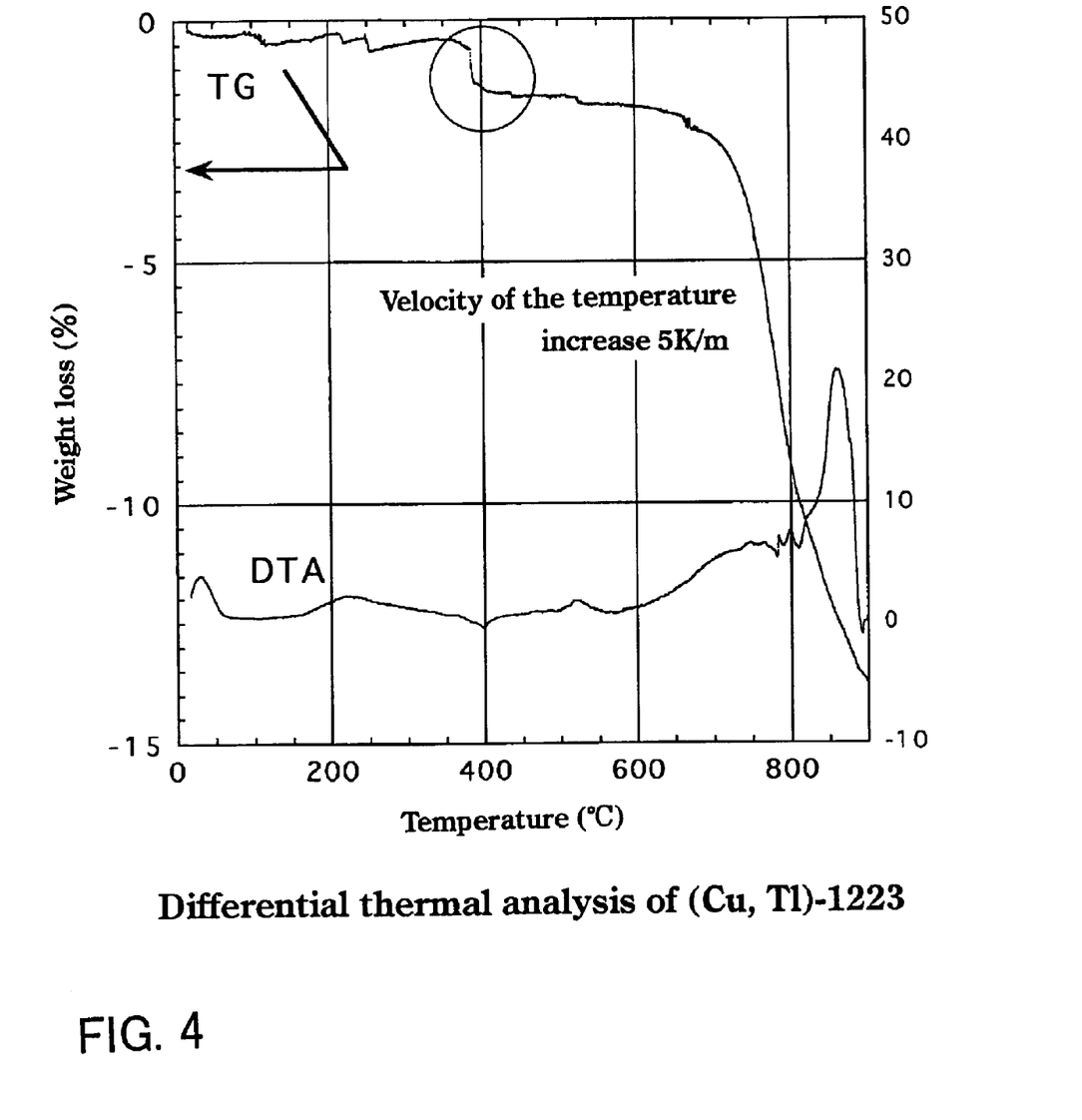
FIG. 4 is a diagram showing thermo-analysis data according to the first form of embodiment of the invention.

FIG. 4 is a diagram showing thermo-analysis data in the first form of embodiment of the invention. From the results of the thermo-gravimetric analysis (TG), it is shown that the weight decreases as the annealing temperature is raised and especially that it falls sharply in the vicinity of 400° C. and in excess of 700° C. From the results of the differential thermo-analysis (DTA), it is also seen that the losses in weight near 400° C. and more than 700° C. are each due to emission of oxygen and Tl.

Figure 5:
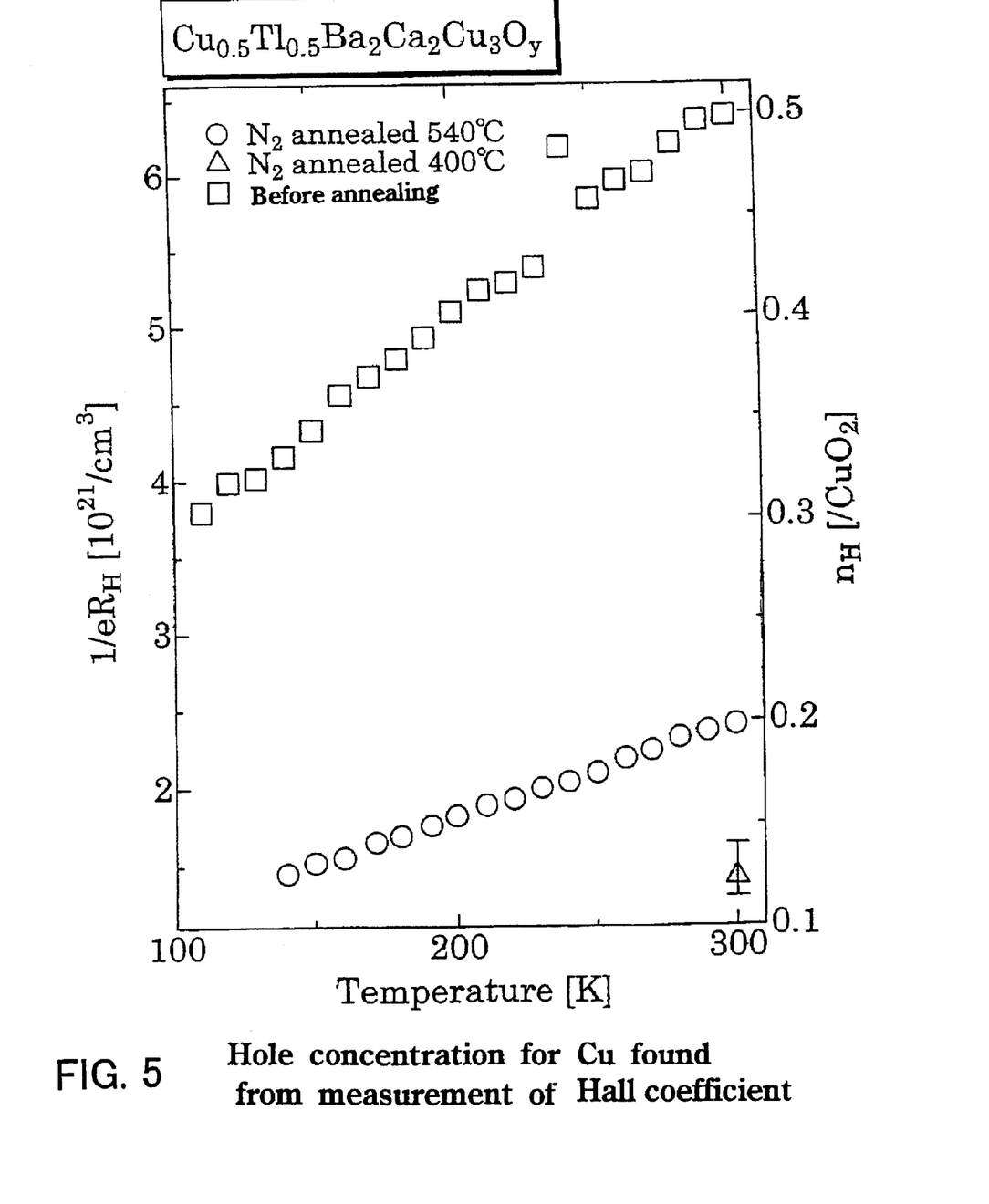
FIG. 5 is a diagram showing change of the hole concentration with temperature according to the first form of embodiment of the invention annealed in nitrogen atmosphere.

FIG. 5 is a diagram showing that the hole density changes with the temperature in the first form of embodiment of the invention.

Figure 6:
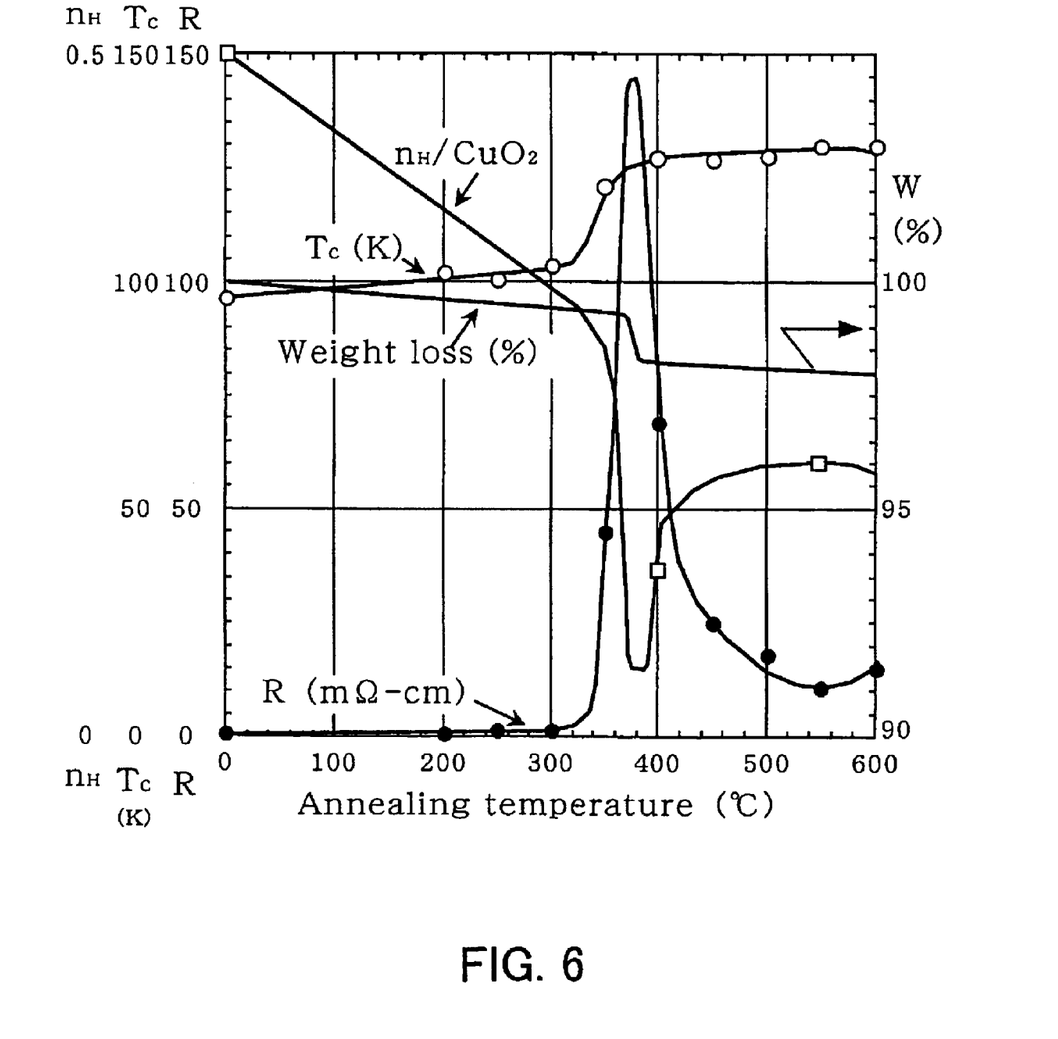
FIG. 6 is a diagram showing relationships between Tc, normal conduction electrical resistivity, carrier concentration, weight's rate of change of, and annealing temperature for, specimens according to the first form of the invention annealed in nitrogen atmosphere.

As shown in FIG. 5, the carriers for Cu found from measurement of Hall coefficient has a density of 0.5 at the temperature of 300 K for a specimen as it is formed by high pressure synthesis, which leaves the specimen over-doped. However, annealing changes the carrier density. Thus, while annealing at 400° C. reduces the carrier density to 0.12 and brings the specimen into an under-doped state, annealing at 540° C. gives rise to a carrier density of 0.2 and brings the specimen almost into an optimum-doped state. FIG. 6 is a diagram showing relationships between Tc of a specimen in the first form of embodiment of the invention annealed, its normally conducting electrical resistivity, carrier density and weight's rate of change and the annealing temperature.

Referring to FIG. 6, annealing a specimen in an over-doped state causes oxygen to come out of it, resulting in a decreases in its carrier concentration and hence a rise in Tc. At the annealing temperature of 400° C., oxygen coming off radically brings the specimen into an under-doped state while maintaining Tc high.

A rise further in the annealing temperature further decreases the oxygen concentration, but is followed by a change in electronic state which increases the carrier concentration so it nears its optimum doping amount. And at the annealing temperature of 540° C., Tc becomes its maximum. And ye, at any temperature of 700° C. or more, oxygen further coming off causes the specimen to deteriorate.

The phenomenon that a change in electronic state increases the carrier concentration has been mentioned before in connection with FIGS. 7 and 8, and can be explained as follows: To wit, Tl ions present in charge supply layers are trivalent (+3) and Tl6 s level lies above the Fermi level (Es) if the oxygen concentration is high. As the oxygen concentration lowers, Tl ions are reduced to become monovalent (+1) and the Tl6 s level becomes lower than the Fermi level. This causes Tl ions to pull electrons out of the 5-coordination $CuO_2$ surface that is a superconducting layer and conversely to supply the superconducting, 5-coordination $CuO_2$ surface with holes.

In this manner, selective reduction of Tl ions can supply holes, thereby increasing the carrier concentration.

It should be noted at this point that from measurement of changes in the upper critical magnetic field, a selective reduction type high temperature superconductor is found to have coherence length of 3 Å or more. Also, from measurement of the ratio of the upper critical magnetic field in the c-axis to those in the a- and b-axes, its superconducting anisotropy is found to be 10 or less.

Mention is next made of a second, preferred form of embodiment of the invention.

This second form of embodiment is a thin film of a selective reduction type high temperature superconductor having a composition: $(Cu_{1-x}Tl_x)(Ba, Sr)_2Ca_2Cu_3O_y$ with the structure, like that of the afore-mentioned first form, as shown FIG. 2A.

Continued, an explanation is given in respect of a method of making for the second form of embodiment.

First, a precursor component Cu—Ba—Ca—O has $Tl_2O_3$ uniformly mixed therewith in an amount of 0.25 to 0.5 mol to prepare:

$Cu_{1-x}Tl_xBa_2Ca_3Cu_4O_y$ where x=0.25 to 0.5, and by pressing to form thallium mixed pellets each of a diameter of 10 mm and a weight of about 450 mg.

Next, such a thallium mixed pellets is pre-heated for 1 hour to prepare a pellet for thallium adjustment.

Next, a $SrTiO_3$ substrate has an amorphous film of $(Cu_{1-x}Tl_x)(Ba, Sr)_2Ca_2Cu_3O_y$ built up thereon by RF magnetron spattering using, for example, a sintered $TlBaSrCa_2Cu_3O_y$ body as a target.

Subsequently, the $SrTiO_3$ substrate having the amorphous film built up thereon, the thallium mixed pellet and the pellet for thallium adjustment are encapsulated in a capsule made of Au, Ag or Pt and then are heat-treated at a temperature of 860° C. to 890° C. for a period of 30 to 90 minutes to cause an epitaxy film of $(Cu_{1-x}Tl_x)(Ba, Sr)_2Ca_2Cu_3O_y$ to epitaxially grow from the amorphous film. This process will be referred to below as "amorphous phase epitaxy (APE) process".

The superconductor film of $(Cu_{1-x}Tl_x)(Ba, Sr)_2Ca_2Cu_3O_y$ obtained by the APE process is annealed in a low oxygen gaseous atmosphere of 1 atm or less at a temperature of 500° C. for a period of 30 minutes to prepare a selective reduction type, high temperature superconductor of the composition with x=0.4 to 0.8 as the second form of embodiment of the invention.

It should be noted here that the method of making described above for the second form of embodiment is applicable to a (Cu, M) family, high temperature superconductor as well with the composition formula (c) mentioned in connection with the first form of embodiment of the invention. Here again as there, selective reduction can yield a positive hole dopable, high temperature superconductor.

The second form of embodiment of the invention is advantageous in that it gives rise to Jc that is so high as $Jc=1\times10^6$ to $2\times10^7$ $A/cm^2$ (77K, 0T).

Figure 9:
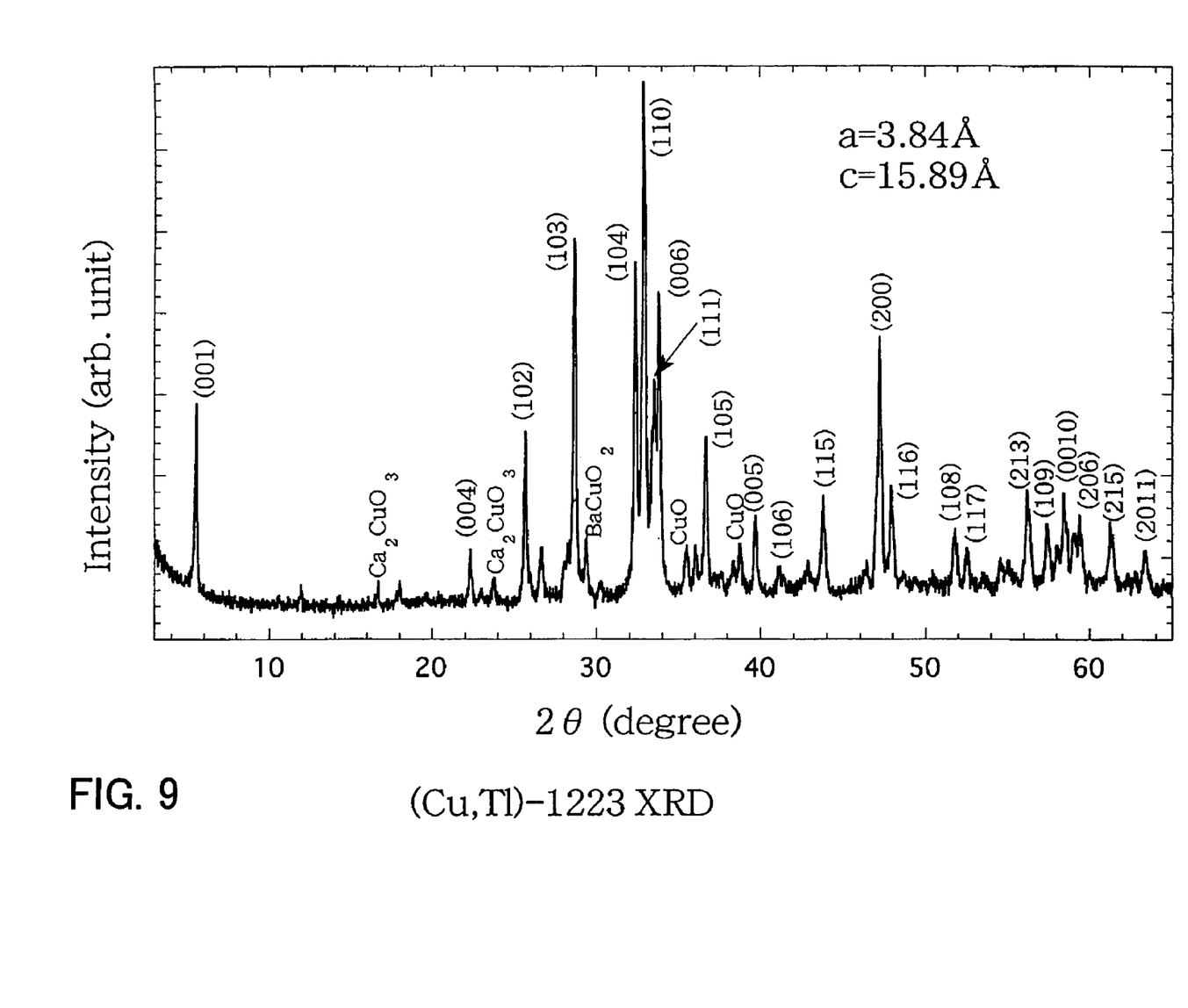
FIG. 9 is a diagram showing an X-ray diffraction analysis pattern according to a second form of embodiment of the present invention.

FIG. 9 is a diagram showing an X-ray analysis pattern of a specimen in the second form of the invention.

As shown in FIG. 9, a strong (001) peak is found, indicating that a c-axis orientation is the case. The c-axis here has a lattice constant of 15.89 Å that lies between 14.79 Å of a Cu-oxide high temperature superconductor and 15.93 Å of Tl-oxide high temperature superconductor.

Also, from observation of X-ray culminating (peak, extreme) points it has been confirmed that an in-plane orientation is the case ($\Delta\phi$=0.5 to 1.5 degree).

It has further been shown that the composition $(Cu_{1-x}Tl_x)(Ba, Sr)_2Ca_2Cu_3O_y$ y if annealed at a temperature of 870 to 900° C. for a period of 30 to 90 minutes has Tc=96 to 115 K and Jc=1×10$^6$ to 2×10$^7$ A/cm$^2$ (77K, OT).

Mention is next made of a third, preferred form of the present invention. The selective reduction type high temperature superconductor in the third form of embodiment is a superconductor film of n=4, the composition $Cu_{1-x}Tl_xBa_2Ca_3Cu_4O_y$ having a structure as shown in FIG. 2B. This structure as indicated in the Figure is referred to herein as Cu-1234.

An explanation is given in respect of a method of making a superconductor in the third form of embodiment of the invention.

A SrTiO$_3$ substrate has an amorphous film of $(Cu_{1-x}Tl_x)Ba_2Ca_3Cu_4O_y$ built up thereon by RF magnetron spattering using a sintered body composed of $Cu_{1-x}Tl_xBa_2Ca_3Cu_4O_y$ as a target.

The amorphous film, together with pellets as mentioned in connection with the second form of embodiment, in a capsule made of Au, Ag or Pt and then is heat-treated at a temperature of 880° C. to 920° C. for a period of 1 hour. Further, the heat-treated amorphous film after having an electrode film of Au deposited thereon is annealed in a low oxygen gaseous atmosphere of 1 atm or less at a temperature of 450 to 500° C. for a period of 30 minutes to prepare a selective reduction type high temperature superconductor as the third form of embodiment of the invention.

The preceding method used to make a superconductor in the third form of embodiment is applicable to making a selective reduction type high temperature superconductor that can be indicated by composition formula (d):

$$Cu_{1-x}Tl_x(Ba_{1-y}Sr_y)_2(Ca_{1-z}L_z)_3Cu_4O_{12-w}$$

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

An explanation is next given in respect of properties of a selective reduction type high temperature superconductor according to the third form of embodiment of the present invention.

X-ray analysis of the thin film shows that it has a lattice constant of 18.9 to 18.5 Å that lies between 17.99 Å of Cu-1234 and 19.11 Å of Tl-1234.

The X-ray peak pattern has a half-width $\Delta$=0.5 to 1.5, indicating a good orientation in the a-b plane.

Further, from composition analysis by an energy distribution type composition analyzer (EDX), it has been found that x=0.4 to 0.8 and from measurement of electrical resistivity Tc has been found to be 100 to 115 K. Jc has been found to lie between 1 and 2×10$^6$ A/cm$^2$. Improving the preparation process may further rise both Tc and Jc.

While a method of making a selective reduction type, high temperature superconductor according to the present invention permits changing n by its preparation composition or the preparation composition of the target material, it should be noted that the n can be changed by changing the reaction temperature and the treatment time period as well. A selective reduction type high temperature superconductor of optimum properties has currently been found to be obtainable with n of 4 to 6 and a thickness of unit lattice $(CaCuO_2)_n$ of 10 to 16 Å.

Although the present invention has hereinbefore been set forth with respect to certain illustrative forms of embodiments thereof, it will readily be appreciated to be obvious to a person skilled in the art that many alternations thereof, omissions therefrom and additions thereto can be made without departing from the essences of scope of the present invention. Accordingly, it should be understood that the invention is not intended to be limited to the specific forms of embodiment thereof set forth below, but to include all possible forms of embodiment thereof that can be made within the scope with respect to the features specifically set forth in the appended claims and encompasses all the equivalents thereof.

Industrial Applicability

As has been set forth in the foregoing description, a selective reduction type high temperature superconductor and a method of making the same according to the present invention are extremely useful in the superconducting electronics industry that involves large scale superconducting power transmission, superconducting power storage or reserve, superconducting electronic components such as a high performance Josephson device, a high frequency device or the like.

What is claimed is:

1. A selective reduction type high temperature superconductor, characterized in that the high temperature superconductor has a unit cell that comprises a pair of charge supply layers formed by an upper and a lower surface thereof having each of a portion of Cu atoms substituted with a selectively reducible atom, and superconducting layers as layers other than said charge supply layers, wherein said charge supply layers have said selectively reduced atoms selectively reduced, characterized in that the superconductor is made of a (Cu, M) family high temperature superconducting material that can be described by composition formula:

$$Cu_{1-x}M_x(Ba_{1-y}Sr_y)_2(Ca_{1-z}L_z)_{n-1}Cu_nO_{2n+4-w}$$

where M represents ions of one or more polyvalent metallic elements selected from the class which consists of Tl, Bi, Pb, In, Ga, Sn, Ti, V, Cr, Mn, Fe, Co, Ni, Zr, Nb, Mo, W, Re and Os; L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

2. A selective reduction type high temperature superconductor as set forth in claim 1, characterized in that selective reduction as aforesaid of said high temperature superconductor forms in said superconducting layers of the high temperature superconductor a first and a second region which are doped overly and doped optimally, respectively, with superconducting carriers.

3. A selective reduction type high temperature superconductor as set forth in claim 1 or claim 2, characterized in that selective reduction as aforesaid of said high temperature superconductor maintains a superconducting carrier concentration in said superconducting layers into as doped overly or as doped optimally with the superconducting carriers.

4. A selective reduction type high temperature superconductor as set forth in claim 1 or 2, characterized in that said superconducting layers of said high temperature superconductor have an upper and a lower surface constituted by a $CuO_2$ surface of a 5-coordination and a surface other than the upper and lower constituted by a CuO2 surface of a 4-coordination.

5. A selective reduction type high temperature superconductor as set forth in claim 1 or 2, characterized in that it is made of a (Cu, Tl) family high temperature superconducting material that can be described by composition formula:

$$Cu_{1-x}Tl_x(Ba_{1-y}Sr_y)_2(Ca_{1-z}L_z)_{n-1}Cu_nO_{2n+4-w}$$

where L represents one or more elements selected from the claims which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$.

6. A selective reduction type high temperature superconductor as set forth in claim 1 or claim 2, characterized in that it is made of a (Cu, Tl) family high temperature superconducting material that can be described by composition formula:

$$Cu_{1-x}Tl_x(Ba_{1-y}Sr_y)_2(Ca_{1-z}L_z)_2Cu_3O_{10-w}$$

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

7. A selective reduction type high temperature superconductor as set forth in claim 1 or claim 2, characterized in that it is made of a high temperature superconducting material that can be described by composition formula:

$$Cu_{1-x}Tl_x(Ba_{1-y}Sr_y)_2(Ca_{1-z}L_z)_3Cu_4O_{12-w}$$

where L represents one or more elements selected from the class which consists of Mg and alkaline metallic elements; $0 \leq x \leq 1.0$; $0 \leq y \leq 1$; $0 \leq z \leq 1$; and $0 \leq w \leq 4$.

8. A selective reduction type high temperature superconductor as set forth in claim 1 or claim 2, characterized in that the concentration of superconducting carriers is adjusted by selective reduction or by varying (increasing or decreasing) oxygen concentration.

9. A selective reduction type high temperature superconductor as set forth in claim 1, characterized in that it is a selectively over-doped type or a selectively optimum-doped type, high temperature superconductor in which n is any one of 3, 4, 5, 6, and 7.

10. A selective reduction type high temperature superconductor as set forth in claim 1 or claim 2, characterized in that selective reduction causes said substitutional atoms in a said charge supply layer to receive electrons in their outer shell orbits, thereby providing holes in the $CuO_2$ surface of 5-coordination of said superconducting layer.

11. A selective reduction type high temperature superconductor as set forth in claim 1 or claim 2, characterized in that it has a superconducting anisotropy of not greater than 10, and a coherence distance of not less than 3 angstroms.

12. A selective reduction type high temperature superconductor as set forth in claim 1 or claim 2, characterized in that said selective reduction transforms its natural superconducting wave function that is of a d-wave to a wave function of a (d+is) wave that has also a property of an s-wave.

13. A method of making a selective reduction type high temperature superconductor, characterized in that it comprises the steps of:

adding an element exhibiting a self-assembling effect and selective reducibility to a raw material of a high temperature superconductor; using the self-assembling effect of said element to cause a crystal of high temperature superconductor to grow with a structure in which said element is substituted for a portion of Cu atoms in a charge supply layer of a basic cell of the high temperature superconductor; and using the selective reducibility of said element to selectively reduce said element in the charge supply layer of the basic cell of said high temperature superconductor crystal, characterized in that the superconductor is made of a (Cu, M) family high temperature superconducting material that can be described by composition formula:

$$Cu_{1-x}M_x(Ba_{1-y}Sr_y)_2(Ca_{1-z}L_z)_{n-1}Cu_nO_{2n+4-w}$$

where M represents ions of one or more polyvalent metallic elements selected from the class which consists of Tl, Bi, Pb, In, Ga, Sn, Ti, V, Cr, Mn, Fe, Co, Ni, Zr, Nb, Mo, W, Re and Os; L represents one or more elements selected from the class which consists of Mg and alkaline metallic elements: $0 \leq x \leq 1.0$; $0 \leq y \leq 1$; $0 \leq z \leq 1$; $0 \leq w \leq 4$; and $1 \leq n \leq 16$.

14. A method of making a selective reduction type high temperature superconductor as set forth in claim 13, characterized in that:

the step of causing the high temperature superconductor crystal to grow includes the step of admixing together a precursor of the high temperature superconductor, a chemical compound of said element and a oxidizing and a reducing agent to form a mixture thereof, and heat treating said mixture in a high pressure condition; and the step of selective reduction comprises heat treating said high temperature superconductor crystal in a reducing atmosphere.

15. A method of making a selective reduction type high temperature superconductor as set forth in claim 14, characterized in that:

said mixture comprises a mixture formed by admixing said precursor represented by composition formula: $Ba_2Ca_2Cu_3O_7$, said element chemical composition constituted by $Tl_2O_3$, said oxidizing agent constituted by AgO or $CaO_2$ and said reducing agent constituted by $Cu_2O$ with a prepared composition: $Cu_{0.5}Tl_{0.5}Ba_2Ca_2Cu_3O_y$;

the step of causing high temperature superconductor to crystallographically grow includes a heat treatment under a high pressure of 5 Gpa at a temperature of 850° C. for a period of 2 hours; and the step of selective reduction includes a heat treatment at a temperature of 400 to 700° C., preferably at 540° C., for a period of 12 hours in a reducing atmosphere in $N_2$;

thereby forming a selective reduction type high temperature superconductor having a Cu-1223 structure and represented by composition formula:

$$(Cu_{1-x}Tl_x)Ba_2Ca_2Cu_3O_y$$

where $0 \leq x \leq 1.0$ and $0 \leq y \leq 1$.

16. A method of making a selective reduction type high temperature superconductor as set forth in claim 14, characterized in that:

the precursor of said high temperature superconductor is a precursor represented by composition formula:

$Cu(Ba_{1-y}Sr_y)_2(Ca_{1-z}L_z)_{n-1}Cu_nO_{2n+4-w}$ where L represents one or more elements selected from the class which consists of Mg and alkaline metallic elements; $0 \leq x \leq 1.0$; $0 \leq y \leq 1$; $0 \leq z \leq 1$; $0 \leq w \leq 4$; and $1 \leq n \leq 16$; and the chemical compound of said element exhibiting said self-assembling effect and said selective reducibility is a compound containing one or more polyvalent metallic elements selected from the class which consists of Tl, Bi, Pb, In, Ga, Sn, Ti, V, Cr, Mn, Fe, Co, Ni, Zr, Nb, Mo, W, Re and Os;

thereby forming a selective reduction type high temperature superconductor having a Cu-1223 structure and represented by composition formula:

$$Cu_{1-x}M_x(Ba_{1-y}Sr_y)_2(Ca_{1-z}L_z)_{n-1}Cu_nO_{2n+4-w}.$$

17. A method of making a selective reduction type high temperature superconductor, characterized in that it comprises the steps of:

heat treating in an atmosphere of an element exhibiting a self-assembling effect and a selective reducibility an amorphous film of a high temperature superconductor composition containing said element deposited on a single crystalline substrate;

using the self-assembling effect of said element and an epitaxy effect of said single crystalline substrate to cause a high temperature superconductor to crystallographically grow with a structure having said element substituted for a portion of Cu atoms in a charge supply layer of a basic cell of the high temperature superconductor; and using the selective reducibility of said element to selectively reduce said element in the charge supply layer of the basic cell of said high temperature superconductor, characterized in that the superconductor is made of a (Cu, M) family high temperature superconducting material that can be described by composition formula:

$$Cu_{1-x}M_x(Ba_{1-y}Sr_y)_2(Ca_{1-z}L_z)_{n-1}Cu_nO_{2n+4-w}$$

where M represents ions of one or more polyvalent metallic elements selected from the class which consists of Tl, Bi, Pb, In, Ga, Sn, Ti, V, Cr, Mn, Fe, Co, Ni, Zr, Nb, Mo, W, Re and Os; L represents one or more elements selected from the class which consists of Mg and alkaline metallic elements: $0 \leq x \leq 1.0$; $0 \leq y \leq 1$; $0 \leq z \leq 1$; $0 \leq w \leq 4$; and $1 \leq n \leq 16$.

18. A method of making a selective reduction type high temperature superconductor as set forth in claim 17, characterized in that:

the step of causing said high temperature superconductor to crystallographically grow includes the steps of preparing a mixture pellet containing said element and a pellet for adjusting the concentration of said element, depositing said amorphous film on said single crystalline substrate by spattering a target of a high temperature superconductor composition containing said element, and heat treating said mixture pellet, said concentration adjustment pellet and said amorphous film commonly in a closed container; and the step of selective reduction includes heat treating said high temperature superconductor crystal in a reducing atmosphere.

19. A method of making a selective reduction type high temperature superconductor as set forth in claim 18, characterized in that:

said mixture pellet is a mixture of a high temperature superconductor precursor whose constituent elements are Cu, Ba, Ca and O with $Tl_2O_3$ as a chemical compound of said self-assembling effect and selective reducibility exhibiting element in a composition range expressed by composition formula:

$$Cu_{1-x}Tl_xBa_2Ca_3Cu_4O_y$$

where x=0.25 to 0.5 and formed by pressing;

said concentration adjustment pellet is a thallium concentration adjustment pellet formed by heat treating a said mixture pellet for a period of 1 hour;

said amorphous film is obtained by spattering a sintered target of a composition expressed by composition formula: $TlBaSrCa_2Cu_3O_y$ to deposit the composition on a $SrTiO_3$ substrate; the heat treatment in said closed container is performed at a temperature of 860 to 900 for a period of 30 to 90 minutes;

the step of selective reduction include a heat treatment effected at a temperature of 500° C. for a period of 30 minutes in a reducing atmosphere of a low pressure oxygen gas at a pressure not in excess of 1 atm; and thereby forming a selective reduction type high temperature superconductor having a Cu-1223 structure and expressed by composition formula:

$$(Cu_{1-x}Tl_x)(BaSr)_2Ca_2Cu_3O_y \text{ where } x=0.4 \text{ to } 0.8.$$

20. A method of making a selective reduction type high temperature superconductor as set forth in claim 18, characterized in that:

said mixture pellet is a mixture of a high temperature superconductor precursor whose constituent elements are Cu, Ba, Ca and O with a chemical compound containing one or more of self-assembling effect and selective reducibility exhibiting elements as aforesaid M selected from the class which consists of Tl, Bi, Pb, In, Ga, Sn, Ti, V, Cr, Mn, Fe, Co, Ni, Zr, Nb, Mo, W, Re and Os in a composition range expressed by composition formula:

$$Cu_{1-x}M_xBa_2Ca_3Cu_4O_y$$

where x=0.25 to 0.5 and formed by pressing;

said concentration adjustment pellet comprises an M concentration adjustment pellet formed by heat treating a said mixture pellet for a period of 1 hour;

said target is a sintered target of a composition expressed by composition formula: $TlBaSrCa_2Cu_3Oy$; and thereby forming a (Cu, M) family, selective reduction type high temperature superconductor having a Cu-1223 structure and expressed by composition formula:

$$Cu_{1-x}M_x(Ba_{1-y}Sr_y)_2(Ca_{1-z}L_z)_{n-1}Cu_nO_{2n+4-w}.$$

21. A method of making a selective reduction type high temperature superconductor as set forth in claim 18, characterized in that:

said mixture pellet is a mixture of a high temperature superconductor precursor whose constituent elements are Cu, Ba, Ca and O with Tl2O3 as a chemical compound of said self-assembling effect and selective reducibility exhibiting element in a composition range expressed by composition formula:

$$Cu_{1-x}Tl_xBa_2Ca_3Cu_4O_y$$

where x=0.25 to 0.5 and formed by pressing;

said concentration adjustment pellet is a thallium concentration pellet formed by heat treating a said mixture pellet for a period of 1 hour;

said amorphous film is obtained by spattering a sintered target of a composition expressed by composition formula: $Cu_{1-x}Tl_xBa_2Ca_3Cu_4O_y$ to deposit the composition on a $SrTiO_3$ substrate; the heat treatment in said closed container is performed at a temperature of 880 to 920° C. for a period of 60 minutes;

the step of selective reduction include a heat treatment effect at a temperature of 450 to 500° C. for a period of 30 minutes in a reducing atmosphere of low pressure oxygen gas at a pressure not in excess of 1 atm; and thereby forming a selective reduction type high temperature superconductor having a Cu-1234 structure and expressed by composition formula:

$$Cu_{1-x}Tl_xBa_2Ca_3Cu_4O_y.$$

22. A method of making a selective reduction type high temperature superconductor as set forth in claim 18, characterized in that:

said mixture pellet is a mixture of a high temperature superconductor precursor whose constituent elements are Cu, Ba, Ca and O with Tl2O3 as a chemical compound of said self-assembling effect and selective reducibility exhibiting element in a composition range expressed by composition formula:

$$Cu_{1-x}Tl_xBa_2Ca_3Cu_4O_y$$

where x=0.25 to 0.5 and formed by pressing;

said concentration adjustment pellet is a thallium concentration adjustment pellet formed by heat treating a said mixture pellet for a period of 1 hour;

said amorphous film is obtained by spattering a sintered target of a composition expressed by composition formula: $Cu_{1-x}Tl_x(Ba_{1-y}Sr_y)_2(Ca_{1-z}L_z)_3Cu_4O_{12-w}$ to deposit the composition a SrTiO3 substrate; and thereby forming a selective reduction type high temperature superconductor having a Cu-1234 structure and expressed by composition formula:

$$Cu_{1-x}Tl_x(Ba_{1-y}Sr_y)_2Ca_3Cu_4O_y$$

where $0 \leq x \leq 1.0 \ 0 \leq y \leq 1; \ 0 \leq z \leq 1; \text{ and } 0 \leq w \leq 4.$

* * * * *